(12) United States Patent
Dubois

(10) Patent No.: US 7,704,676 B2
(45) Date of Patent: Apr. 27, 2010

(54) BLOCK COPOLYMERS HAVING DISTINCT ISOPRENE AND BUTADIENE MIDBLOCKS, METHOD FOR MAKING SAME, AND USES FOR SUCH BLOCK COPOLYMERS

(75) Inventor: Donn Dubois, Houston, TX (US)

(73) Assignee: Kraton Polymers U.S. LLC, Houston, TX (US)

( * ) Notice: Subject to any disclaimer, the term of this patent is extended or adjusted under 35 U.S.C. 154(b) by 329 days.

(21) Appl. No.: 11/849,896

(22) Filed: Sep. 4, 2007

(65) Prior Publication Data

US 2009/0062420 A1 Mar. 5, 2009

(51) Int. Cl.
*C08L 53/02* (2006.01)
*G03C 1/73* (2006.01)
*G03F 7/00* (2006.01)

(52) U.S. Cl. ............... 430/287.1; 522/114; 522/121; 525/95

(58) Field of Classification Search .............. 522/114, 522/121; 525/95; 430/287.1
See application file for complete search history.

(56) References Cited

U.S. PATENT DOCUMENTS

| | | | |
|---|---|---|---|
| 3,231,635 A | 1/1966 | Holden et al. | |
| 3,251,905 A | 5/1966 | Zelinski | |
| 3,390,207 A | 6/1968 | Moss et al. | |
| 3,598,887 A | 8/1971 | Darcy et al. | |
| 3,984,509 A | 10/1976 | Hall et al. | |
| 4,126,466 A | 11/1978 | Roos | |
| 4,219,627 A | 8/1980 | Halasa et al. | |
| 4,266,005 A | 5/1981 | Nakamura et al. | |
| 4,320,188 A | 3/1982 | Heinz et al. | |
| 4,430,417 A | 2/1984 | Heinz et al. | |
| 4,460,675 A | 7/1984 | Gruetzmacher et al. | |
| 5,213,948 A | 5/1993 | Abele | |
| 5,399,627 A | 3/1995 | Diehl et al. | |
| 5,472,824 A | 12/1995 | Schober et al. | |
| 5,948,594 A | 9/1999 | Dudek et al. | |
| 6,025,098 A * | 2/2000 | Sakurai et al. | 430/18 |
| 6,531,263 B2 | 3/2003 | Knoll | |
| 6,964,996 B1 | 11/2005 | Lee et al. | |
| 7,012,118 B2 * | 3/2006 | Hansen et al. | 525/88 |
| 7,105,600 B2 * | 9/2006 | Kitano et al. | 525/98 |
| 7,207,297 B2 | 4/2007 | Hayami | |
| 7,241,540 B2 * | 7/2007 | St. Clair et al. | 430/18 |
| 7,432,037 B2 * | 10/2008 | Suzuki et al. | 430/286.1 |
| 2004/0072951 A1 | 4/2004 | Hansen et al. | |
| 2005/0020773 A1 * | 1/2005 | Lechat et al. | 525/89 |
| 2005/0137312 A1 | 6/2005 | Dubois | |
| 2005/0233249 A1 | 10/2005 | Muldermans et al. | |
| 2006/0070543 A1 | 4/2006 | De Keyzer et al. | |
| 2006/0155062 A1 | 7/2006 | De Keyzer | |
| 2006/0235133 A1 | 10/2006 | Suzuki et al. | |
| 2007/0148480 A1 | 6/2007 | Ishiwata et al. | |
| 2007/0249781 A1 | 10/2007 | De Keyzer et al. | |

FOREIGN PATENT DOCUMENTS

| | | |
|---|---|---|
| EP | 0 084 851 A2 | 8/1983 |
| EP | 0 387 671 A1 | 9/1990 |
| EP | 0 413 294 A2 | 2/1991 |
| EP | 0 636 654 A1 | 2/1995 |
| EP | 0669350 A1 | 8/1995 |
| EP | 1233028 A1 | 8/2002 |
| EP | 1473595 A1 | 11/2004 |
| EP | 1674489 A1 | 6/2006 |
| GB | 1 366 769 | 9/1974 |
| WO | 94 22931 A1 | 10/1994 |
| WO | 2005063914 A2 | 7/2005 |

* cited by examiner

Primary Examiner—Susan W Berman
(74) Attorney, Agent, or Firm—Clements/Bernard

(57) ABSTRACT

A block terpolymer for use in photocurable compositions, flexographic printing plates or hot melt adhesives having a molecular structure according to the general formula:

$$A\text{-}I\text{-}B\text{-}I\text{-}A \qquad (1)$$

or $$(A\text{-}I\text{-}B)_n\text{-}X \qquad (2),$$

wherein each A is independently a polymer block of predominantly an aromatic vinyl compound, each I is predominantly isoprene, each B is predominantly butadiene, n is an integer equal to or greater than 2, and X is the residue of a coupling agent, and wherein:

(a) the weight ratio of I to B is in a range of 30:70 to 70:30;
(b) the aromatic vinyl compound content of the block copolymer is from about 14 to about 45%;
(c) the B block has a 1,2-vinyl bond content in the range of from about 20 to about 90 mol %;
(d) the A block has an apparent molecular weight in the range of from about 5,000 to about 20,000, and the I and B blocks together have a molecular weight in the range of from about 50,000 to about 200,000;
(e) uncoupled triblock, S-I-B in the range of from about 2% to about 60%.

20 Claims, No Drawings

1

BLOCK COPOLYMERS HAVING DISTINCT ISOPRENE AND BUTADIENE MIDBLOCKS, METHOD FOR MAKING SAME, AND USES FOR SUCH BLOCK COPOLYMERS

FIELD OF THE INVENTION

Some embodiments of the present invention relate to block copolymers for use in photopolymerizing printing plates as well as adhesives and curable adhesives. In particular, some embodiments of the present invention relate to a block copolymer having two distinct conjugated diene mid-blocks, made up of isoprene and butadiene and having a high vinyl content. Embodiments of the present invention further relate to the use of said block copolymer for providing advantageous properties when used in photopolymerizing printing plates as well as adhesives.

BACKGROUND OF THE INVENTION

Photopolymerizable printing plates are known for use in making flexographic printing forms. Generally, characters or images can be produced on the printing surface by exposing the printing plate to actinic radiation through an image bearing transparency. The areas which are exposed to the radiation photopolymerize, and as a result are harder and less soluble than the unexposed areas. Subsequently, the unexposed, non-polymerized areas of the printing plate can be removed, generally by use of a suitable solvent. The photopolymerized areas then remain and are in the form of the image exposed by the radiation treatment. Examples are found in the following patents: GB 1366769, U.S. Pat. No. 4,266,005, U.S. Pat. No. 4,320,188, U.S. Pat No. 4,126,466, U.S. Pat. No. 4,430,417, U.S. Pat. No. 4,460,675 and U.S. Pat. No. 5,213,948.

Such photopolymerizable printing plates usually comprise a support, an optional adhesive layer or other underlayer, one or more photopolymerizable layers, an optional elastomeric intermediate layer and a cover layer.

A generally preferred method for making such multilayer photopolymerizable printing plates is by a process in which a previously extruded photopolymerizable composition is fed into the nip of a calendar and is calendered between a support layer and a cover layer, thus forming a photopolymerizable layer between them. EP 0084851 A disclosed a preparation method for a multilayer photopolymerizable printing plate, having an added elastomeric layer between the cover layer and the photopolymerizable layer.

The photopolymerizable layers can contain polymeric binders, photopolymerizable monomers, photo-initiators, and added auxiliaries such as plasticizers, fillers, stabilizers etc.

It is desirable for the polymers used in the flexographic printing plates to have properties which are beneficial for the preparation and use of such plates. Generally, it is preferred that printing reliefs be flexible, yet resilient, as well as soft enough for non-exposed surfaces to be removed by a suitable solution, and furthermore that they facilitate photopolymerization.

In the past, polymeric binders have been thermoplastic block copolymers as disclosed in e.g. U.S. Pat. No. 6,531,263. These are generally block copoymers of the general formula A-B-A or $(AB)_n$ or $(AB)_nX$, comprising thermoplastic blocks A and elastomeric Blocks B, particularly linear and radial block copolymers with poly (monovinylaromatic hydrocarbon) end blocks.

Non-hydrogenated styrenic block copolymers such as styrene-isoprene-styrene (SIS) and styrene-butadiene-styrene (SBS) can be used to make UV cured, flexographic printing plates. Use of SIS block copolymers generally results in a softer printing plate. However, limitations for these SIS block polymers are that they are less reactive, more expensive and also have limited resistance to degradation by ozone. SBS block copolymers on the other hand are more reactive than SIS copolymers but have greater hardness, resulting in less flexible flexographic printing plates. Also, SBS is known to be more resistant to ozone compared to SIS polymers.

Generally mixing SIS and SBS block copolymers leads to poor results because the blends are generally thermodynamically unstable. Such incompatibility leads to haziness or the phases may even separate. Furthermore, the presence of haze interferes with the curing of the plate by scattering actinic radiation. It is preferred for such flexographic plates to be transparent so that the dispersibility of the radiation is reduced.

There exists a need for an improved block copolymer which would possess the beneficial properties of both SIS and SBS, such as flexibility, lower melt viscosity and high reactivity, while minimizing or eliminating the drawbacks of each block copolymer alone or as a mixture.

Furthermore, there exists a need for improved properties with respect to curable adhesive compositions. It would be advantageous to provide a block polymer which would have improved radiation sensitivity, as well as melt viscosity and a superior balance of properties for use in hot melt, radiation curable adhesive compositions.

SUMMARY OF THE INVENTION

Accordingly, one embodiment of the present invention provides for an elastomeric block copolymer that is a block terpolymer, or a flexographic printing plate that comprises said block terpolymer, said block terpolymer having a molecular structure according to the general formula:

$$\text{A-I-B-I-A} \tag{1}$$

or $$(\text{A-I-B})_n\text{-X} \tag{2},$$

Accordingly, wherein each A is independently a polymer block of predominantly an aromatic vinyl compound, each I is predominantly isoprene, each B is predominantly butadiene, n is an integer equal to or greater than 2, and X is the residue of a coupling agent, and wherein:

(a) the weight ratio of I to B is in a range of 30:70 to 70:30;
(b) the aromatic vinyl compound content of the block copolymer is from about 14 to about 45%;
(c) the B block has a 1,2-vinyl bond content in the range of from about 20 to about 90 mol %;
(d) the A block has an apparent molecular weight in the range of from about 5,000 to about 20,000, and the I and B blocks together have a molecular weight in the range of from about 50,000 to about 200,000;
(e) uncoupled triblock, S-I-B in the range of from about 2% to about 60%.

DETAILED DESCRIPTION

The block terpolymers used according to some embodiments of the current invention have a structure represented by the following general formula:

$$\text{A-I-B-I-A} \tag{1}$$

or $$(\text{A-I-B})_n\text{-X} \tag{2}$$

In the above formulas, each A is independently a polymer block of predominantly aromatic vinyl compound, each I is a polymer block of predominantly isoprene and each B is predominantly butadiene. Furthermore, n is an integer equal to or greater than 2, preferably from about 2 to 4, and X is the residue of a coupling agent. In an even further embodiment, n is 2, 3 or 4. The weight ratio between isoprene and butadiene is in the range of from about 20:80 to about 80:20, preferably from about 30:70 to about 70:30.

As an example of the aromatic vinyl compound useful in the practice of the present invention, may be mentioned styrene, alpha-methylstyrene, p-methylstyrene, o-methylstyrene, p-tert-butylstyrene, 2,4-dimethylstyrene, vinyl naphthalene, vinyltoluene and vinylxylene or mixtures thereof. Of these, styrene is particularly preferred. As used throughout the present application the phrase "predominantly aromatic vinyl compound" means that the A polymer block may contain minor amounts of comonomers other than an aromatic vinyl compound, e.g., up to 5 wt % of a copolymerizable monomer such as butadiene and/or isoprene (based on the weight of the total block). Most preferred are A blocks that comprise substantially pure styrene.

The A blocks can have a true molecular weight in the range of from about 5,000 to about 20,000, preferably from about 8,000 to about 18,000. Furthermore, the true molecular weight range can be at least about 5,000, 8,000, 10,000, or 12,000, and can be at most about 18,000, 15,000, or 13,000. Note that the ranges can also include all combinations of said molecular weights listed herewith.

In some embodiments of the present invention, the aromatic vinyl content, and preferably poly(styrene) content (PSC), of the block copolymers can be in the range of from about 10 to about 45 wt %, preferably from about 10 to about 45 wt %, more preferably from about 14 to about 25 wt %, and still even more preferably from about 15 to about 20 wt %. Furthermore, the aromatic vinyl content can be at a minimum about 10 wt %, 14 wt %, 16 wt %, 18 wt % or 20 wt %, and no more than about 45 wt %, 40, wt %, 35 wt %, 30 wt %, 25 wt %, or 20 wt %. The above ranges can also include all combinations of said vinyl contents listed herewith.

As used herein, the phrases "predominantly isoprene" and "predominantly butadiene" mean that blocks I and B, respectively, may contain minor amounts of other comonomers, e.g. up to 5 wt % of a copolymerizable monomer such as styrene (based on the weight of the total block), or other dienes. For example, the I block may contain a minor amount of butadiene, and/or the B block may contain a minor amount of isoprene. Alternatively, other dienes may be present such as, piperylene, 2,3-dimethyl-1,3-butadiene, 1,3-pentadiene, and 1,3-hexadiene, 1-phenyl-1,3-butadiene, and others having from 4 to 8 carbon atoms, or mixtures thereof. As used herein "butadiene" refers specifically to "1,3-butadiene". It is preferred that the block copolymers contain blocks of substantially pure styrene, blocks of substantially pure isoprene, and blocks of substantially pure butadiene.

When considered together, the I and B blocks can have an apparent molecular weight in the range of from about 50,000 to about 200,000, preferably from about 75,000 to about 150,000. Furthermore, the apparent molecular weight range can be at least about 50,000, 75,000, 100,000, or 125,000, and can be at most about 200,000, 175,000, or 150,000. Note that the ranges can also include all combinations of said molecular weights listed herewith.

As used herein with regard to the block copolymers of the present invention, the term "molecular weights" refers to the true molecular weight in g/mol of the polymer or block of the copolymer or terpolymer. The molecular weights referred to in this specification and claims can be measured with gel permeation chromatography (GPC) using polystyrene calibration standards, such as is done according to ASTM 3536. GPC is a well-known method wherein polymers are separated according to molecular size, the largest molecules eluting first. The chromatograph is calibrated using commercially available polystyrene molecular weight standards. The molecular weight of polymers measured using GPC so calibrated are styrene equivalent or apparent molecular weights. The styrene equivalent molecular weight may be converted to true molecular weight when the styrene content of the polymer and the vinyl content of the diene segments are known. The detector used is preferably a combination ultra violet and refractive index detector. The molecular weights expressed herein are measured at the peak of the GPC trace and are commonly referred to as "peak molecular weights."

In some embodiments, the block polymer can be prepared by full sequential polymerization, optionally in combination with reinitiation, and the coupling method, as illustrated in e.g. U.S. Pat. No. 3,231,635; U.S. Pat. No. 3,251,905; U.S. Pat. No. 3,390,207; U.S. Pat. No. 3,598,887; U.S. Pat. No. 4,219,627; EP 0413294 A2, EP 0387671 B1, EP 0636654 A1 and WO 94/22931.

Sequential polymerization can be conducted by anionic polymerization of predetermined batches of monovinyl aromatic hydrocarbon monomer, isoprene and butadiene in an inert organic solvent. In this process, the aromatic vinyl compound is polymerized first, followed by isoprene. Butadiene is then introduced until the monomer has been exhausted. Thereafter isoprene is introduced again, which is then followed by the aromatic vinyl compound to complete the pentablock terpolymer. Using this process, monomer or monomers to be polymerized sequentially are contacted with an anionic polymerization initiator such as group IA metals, their alkyls, amides, silanolates, naphthalides, biphenyls or anthracenyl derivatives. It is preferred to use an organo alkali metal (such as lithium or sodium or potassium) compound in a suitable solvent at a temperature within the range from about −150° C. to about 300° C., preferably at a temperature within the range from about 0° C. to about 100° C. Particularly effective anionic polymerization initiators are organo lithium compounds having the general formula:

$$RLi_n$$

wherein R is an aliphatic, cycloaliphatic, aromatic or alkyl-substituted aromatic hydrocarbon radical having from 1 to about 20 carbon atoms, of which sec-butyl is preferred, and n is an integer of 1 to 4. The organolithium initiators are preferred for polymerization at higher temperatures because of their increased stability at elevated temperatures.

Suitable solvents for making the block terpolymers of the present invention include those useful in the solution polymerization of the polymer and include aliphatic, cycloaliphatic, alkyl-substituted cycloaliphatic, aromatic and alkyl-substituted aromatic hydrocarbons, ethers and mixtures thereof. More specific examples of suitable solvents include aliphatic hydrocarbons such as butane, pentane, hexane and heptane, cycloaliphatic hydrocarbons such as cyclopentane, cyclohexane and cycloheptane, alkyl-substituted cycloaliphatic hydrocarbons such as methylcyclohexane and methylcycloheptane, aromatic hydrocarbons such as benzene and the alkyl-substituted hydrocarbons such as toluene and xylene, and ethers such as tetrahydrofuran, diethylether and di-n-butyl ether. Preferred solvents are cyclopentane or cyclohexane.

In a preferred embodiment of the present invention, the block copolymer according to the present invention can be prepared by coupling of an initially prepared living block polymer, obtained by sequential polymerization. In this case, however, the aromatic vinyl monomer is polymerized first, followed by isoprene, and thereafter butadiene. The living block polymer chain is then subject to a coupling reaction. The coupling reaction occurs between the living polymer having the formula P—Li and a multifunctional coupling agent, wherein Li is lithium and P is the initially prepared block polymer chain.

The coupling agent used can be any di- or polyfunctional coupling agent known in the art. As examples of the coupling agent may be mentioned tin coupling agents such as tin dichloride, monomethylin dichloride, dimethyitin dichloride, monoethyltin dichloride, diethyltin dichloride, methyltin trichloride, monobutyltin dichloride, dibutyltin dibromide, monohexyltin dichloride and tin tetrachloride; halogenated silicon coupling agents such as dichlorosilane, monomethyldichlorosilane, dimethyldichlorosilane, monoethyldichlorosilane, diethyldichlorosilane, monobutyldichlorosilane, dibutyldichlorosilane, monohexyldichlorosilane, dihexyldichlorosilane, dibromosilane, monomethyldibromosilane, dimethyldibromosilane, silicon tetrachloride and silicon tetrabromide; alkoxysilanes such as tetramethoxysilane, glycidoxytrimethoxy silane, and oxydipropylbis(trimethoxy silane); divinyl aromatic compounds such as divinylbenzene and divinylnaphthalene; halogenated alkanes such as dichloroethane, dibromoethane, methylene chloride, dibromomethane, dichloropropane, dibromopropane, chloroform, trichloroethane, trichloropropane and tribromopropane; halogenated aromatic compounds such as dibromobenzene; epoxy compounds such as the diglycidyl ether of bisphenol-A and the like (e.g., EPON™ 825 or EPON™ 826 diglycidyl ether) and other coupling agents such as benzoic esters, CO2 and 1-chloro-1,3-butadiene, diethyl adipate or dimethyl adipate. Further coupling agents may be, polyisocyanates, polyimines, polyaldehydes, polyketones, polyanhydrides, polyesters, and 1,3,5-benzenetricarboxylic acid trichloride. Of these, EPON™ 826 diglycidyl ether, methyltrimethoxysilane, tetramethoxysilane, tetraethoxysilane, or other alkoxysilanes are preferred.

In both sequential polymerization and coupling preparation methods, the remaining living block polymer can be terminated by addition of a proton donating agent, such as an alkanol, e.g. ethanol or water.

The effectiveness of the coupling reaction is referred to as coupling efficiency. The coupling efficiency is expressed normally and herein as the percentage of the living anionic polymeric arms that are incorporated into a coupled structure having at least two arms divided by the total number of molecules of coupled polymer plus the number of molecules of uncoupled polymer. Uncoupled polymer in this case will be triblock copolymer. It is preferred that the coupling efficiency be at least about 40%, preferably at least about 85%, more preferably at least about 90%, and most preferably at least about 98%. The coupling efficiency can also have a range of from about 40% to about 98%.

It will be appreciated that block copolymers, prepared by means of coupling of living triblock copolymers by means of a coupling agent and termination of remaining living block copolymers will finally contain tri-block copolymer. Tri-block content, if any, is preferably less than about 60% by weight, less than about 35 wt %, less than about 30 wt %, less than about 25 wt %, less than about 20 wt %, less than about 15 wt %, less than about 10 wt % on the basis of the block copolymers used as component (a).

Furthermore, the microstructure or vinyl content of the I and B blocks of the present invention can be controlled. The term "vinyl content" with respect to the diene blocks describes the polymer product that is made when 1,3-butadiene is polymerized via a 1,2-addition mechanism. The result is a monosubstituted olefin group pendant to the polymer backbone, therefore known as a vinyl group. In the case of anionic polymerization of isoprene, insertion of the isoprene via a 3,4-addition mechanism affords a geminal dialkyl C=C moiety pendant to the polymer backbone.

In some embodiments of the present invention, the B block of the block polymer of the present invention will have a vinyl content of from about 20 to about 90 mol %, preferably from about 30 to about 60 mol %. The vinyl content of the B block can be at least about 20 mol %, 30 mol %, 40 mol %, 50 mol %, or most preferably at least 60 mol %. Furthermore, the vinyl content of the B block can be at most about 60%, 70%, 80%, or most preferably 90%. The above ranges can also include all combinations of said vinyl contents listed herewith.

In other embodiments, the 3,4-addition of the I block will be at most about 20%, preferably at most about 15 mol %, more preferably at most about 10 mol %.

In the preferred embodiments the block polymer of the present invention can be prepared by the following steps. First, a vinyl aromatic monomer such as styrene is polymerized. Following this, isoprene is then introduced and polymerized until all the monomer is exhausted. Subsequently, a microstructure modifying agent can be added, followed by the introduction of a butadiene monomer. The microstructure modifying agent controls the 1,2-addition of the butadiene monomer. After the butadiene is polymerized, a coupling agent is then added, thereby forming a tri-block polymer chain with a coupling agent attached to the butadiene block end. Coupling reactions result in the formation of the desired pentablock polymer, along with some amount of uncoupled tri-block polymer.

The block copolymers of the formula (1) and (2) according to the present invention can be used as a component in a photopolymerizable or photocurable composition. Flexographic printing plates can be derived from such photopolymerizable compositions, and thereafter, flexographic printing relief forms can be prepared. In the present invention the photocurable composition comprises:

(a) an elastomeric block copolymer of formula (1) or (2) as defined hereinbefore;

(b) from about 1 to about 60% by weight, based on the total weight of components (a) and (b), of one or more ethylenically unsaturated compounds;

(c) from about 0.1 to about 10% by weight, based on the total weight of the photocurable composition, of one or more photoinitiators or photoinitiator systems; and (d) from 0 to about 40% by weight, based on the total photocurable composition, of one or more auxiliaries.

The proportion of block copolymer of the formula (1) or (2) (hereinafter "component (a)") used in the photopolymerizable composition can be from about 20 to about 98.9%, preferably from about 40 to about 98.9% by weight, based on the weight of components (a) and (b). The proportion of component (a) in the photopolymerizable composition can be at least about 20, 30, 40, or 50%, or at most about 98.9, 95, 90, 80, 70, or 60% by weight based on the weight of components (a) and (b). The above ranges can also include all combinations of said vinyl contents listed herewith.

The photopolymerizable compositions to be used according to the present invention further comprise as component (b) polymerizable ethylenically unsaturated compounds selected from monounsaturated or polyunsaturated monomers, such as e.g. esters or amides of acrylic acid or methacrylic acid with monofunctional or polyfunctional alcohols, amines, aminoalcohols and hydroxyethers or hydroxyesters. Such monomers include but are not limited to trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, dimethylolpropane tetraacrylate, triacrylate of tris(hydroxyethyl)isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethanemethacrylate or acrylate oligomers and the like which can be added to the photopolymerizable composition to modify the cured product.

Monoacrylates such as cyclohexyl acrylate, isobornyl acrylate, lauryl acrylate and tetrahydrofurfuryl acrylate and the corresponding methacrylates can also be used.

Also suitable as component (b) are mixtures of monounsaturated and polyunsaturated compounds, as described in U.S. Pat. No. 5,472,824, which is hereby incorporated by reference.

More specific examples of component (b) are butyl acrylate; isodecyl acrylate; 1,6-hexanediol dimethacrylate; 1,6-hexanediol diacrylate; trimethylolpropane triacrylate and dipentaerythritol monohydroxypentacrylate.

More preferred weight proportions of component (b) are in the range of from about 1 to about 60%, from about 1 to about 30%, more preferably from about 5 to about 30% by weight, relative to the weight of components (a) and (b). Additionally, the weight proportions of component (b) can be at least about 1, 2, 5, 10, 15, 20, 25, 30% by weight relative to the weight of components (a) and (b) or at most about 60, 55, 50, 45, 40%, or 35 by weight relative to the weight of components (a) and (b). The above ranges can also include all combinations of said vinyl contents listed herewith.

The photopolymerizable compositions also comprise one one or more photoinitiators or photoinitiator systems, as components (c), e.g. methylbenzoin, benzoin acetate, benzophenone, benzil dimethyl-ketal or ethyl anthraquinone/4,4-bis (dimethyl amiano)benzo-phenone.

The weight proportion of component (c) based on the weight of the total photocurable composition is in the range of from about 0.1 to 10%, more preferably from 0.5 to 5% by weight. Moreover, the weight proportion of component (c) based on the total photocurable composition can be at least about 0.1, 0.2, 0.3 or 0.5% by weight, and less than about 10, 7.5, or 5% by weight. The above ranges can also include all combinations of said vinyl contents listed herewith.

Examples of auxiliaries that can be utilized as component (d) include plasticizers, aromatic resin, additional compatible rubber, fillers, dyes and/or pigments, antioxidants, antiozonants, thermal polymerization inhibitors and liquid poly(isoprene), liquid poly(butadiene) and/or liquid S—B or S—I diblock copolymers. The proportion of auxiliaries can be from 0 to about 40%, or more preferably from about 5 to about 30% based on the total photocurable composition. Moreover, the proportion of auxiliaries can be at least 0, about 5, 10, 15, or 20% of the total photopolymerizable composition, or no more than about 40, 35, 30, or 25%. The above ranges can also include all combinations of said vinyl contents listed herewith.

It will be appreciated that the flexographic printing plates according to the present invention can additionally comprise a support layer, which may consist of sheets of various filmforming synthetic polymers. While any available support layer is contemplated, polyester and polyester/polyamide sheets, optionally having an adhesive layer and/or antihalation layer, are preferred, and in particular polyethylene terephthalate sheets.

Moreover said flexographic printing plates may also comprise a cover element, which is usually composed of a flexible cover film, optionally a flexible polymeric film and/or a layer of elastomeric composition.

Note that the flexible cover film has to be removed before irradiation. This removal can be facilitated by a fine sheet of release agent between the flexible cover film and the flexible layer of polymeric film and/or a layer of elastomeric composition. If present, this elastomeric layer comprises at least one block copolymer as specified hereinbefore.

The photopolymerizable compositions to be used according to the present invention can be prepared in a conventional manner by homogeneously mixing the individual components, for example in solution, or in a kneader, a mixer or an extruder.

Said compositions have good processability and layers of the desired thickness can be produced from the composition by e.g. casting a solution in a suitable solvent, such as toluene, xylene, cyclohexane, cyclopentane, tetrahydrofuran, methyl isobutyl ketone or tetrachloro ethylene, on a appropriate base. Layers of the composition can also be produced by compression molding extrusion and calendaring, and when a suitable process temperature, combined with a suitable inhibitor is used, no incipient thermal cross linking will occur.

The thickness of the layers can be varied within wide limits and can easily be chosen to suit a particular application. The thickness of the layers is usually in the range of from about 0.01 to about 6.5 mm although thicknesses outside of this particular range are also possible.

The flexographic printing plate can be exposed image-wise through a negative by commonly used methods. The cover layer of the flexographic printing plate is removed as usual before image-wise exposure. Any type and source of actinic radiation can be used to prepare the flexographic printing relief forms. Suitable radiation sources are, for example, mercury vapor lamps, incandescent lamps with special phosphors that emit ultraviolet light, argon incandescent lamps and photo lamps. The most suitable among these are mercury vapour lamps, particularly ultraviolet light lamps, and ultraviolet fluorescent lamps.

An overall backside exposure can be made before or after image-wise exposure. This exposure can be diffuse or directional. The exposure source can be all of the radiation sources conventionally used for the image-wise exposure.

As a result of being exposed to actinic radiation, the printing surface will photopolymerize, while the unexposed portions of the surface will remain unaffected. Therefore, the unexposed portion, or non-photopolymerized portion of the printing surface is generally softer and more readily soluble.

Non-photopolymerized areas of the printing plate can be washed off with suitable developer solutions, such as, for example, aliphatic or aromatic hydrocarbons such as n-hexane, petroleum ether, hydrogenated petroleum fractions, limonene or other terpenes, toluene, isopropyl benzene etc., ketones such as, for example, methylethyl ketone, halogenated hydrocarbons such as chloroform, trichloroethane or tetrachloroethane, esters such as, for example, acetic esters, acetoacetic acid esters or mixtures of these solvents. Additives such as surfactants or alcohols are possible constituents. After being dried, the resulting printing forms can be post-exposed or post-treated chemically in any sequence to make a non-tacky printing surface.

It will be appreciated that an important advantage of the pentablock polymer of the present invention is that there is lower melt viscosity and improved UV reactivity for applications such as flexographic printing plates and cureable hot melt adhesives.

The block copolymers of the current invention can also be used as a component in a radiation curable adhesive composition. Such compositions can comprise at least one block copolymer of formula (1) and (2), at least one tackifier and optionally, at least one plasticizer.

In further embodiments, the curable adhesive composition may further comprise a tackifying resin that is compatible with the elastomeric diene blocks. Suitable aromatic hydrocarbon resins as tackifiers are those having a relative percentage of aromaticity (based on aromatic protons relative to the total number of protons in the molecule as determined by H-NMR) of less than 3 and preferably in the range of from 0 to about 2.8.

Suitable relative inexpensive tackifying resins may be selected from the type generally referred to as aliphatic or slightly mixed aliphatic/aromatic resins or so-called heat reactive hydrocarbon resins. These hydrocarbon resins have a predominantly aliphatic composition. The streams used to produce these resins contain C-9 components (indene and styrene) and various other C-5 monomers or C-5 dimers. Tackifying resins which can be used in the adhesive according to the present invention include saturated resins, esters of resins, polyterpenes, terpene phenol resins, and polymerized mixed olefins or mixtures thereof. The proportion of tackifying resins in total varies from about 10 to about 300 parts per hundred parts by weight of block copolymer (pbw), preferably from about 50 to about 200 pbw.

In the preferred embodiments, the tackifying resins should have a low level of unsaturation in order to achieve low radiation curing dosage of the adhesive composition.

Examples of useful tackifying resins are ESCOREZ™ 5300 series (ExxonMobil); REGALITE™ R91, R101, S100, S260; REGALREZ™ 1018, 3102, 6108, 5095; ZONATAC™ Lite series like the ZONATAC™ 105 LITE; and the like.

Further suitable tackifying resins include ESCOREZ™ 2203, ESCOREZ™ 1310 (ExxonMobil), WINGTACK™ EXTRA, WINGTACK™ 95 (Goodyear Chemicals); PICCOTAC™ 1094, and PICCOTAC™ 1095 (Eastman). A preferred tackifier resin is selected from WINGTACK™ EXTRA, ESCOREZ™ 2203 or PICCOTAC™ 1094. The following resins have a greater amount of C9 component, and are preferred for pressure sensitive adhesives: Wingtack ET, Wingtack 86, Wingtack STS, Piccotac 7590, Piccotac 8060, Hikorez 2100 (Kolon Chemical), Quintone S100 (Zeon Chemical), Escorez 2172.

Furthermore, a modifying resin that is compatible with the poly(vinyl aromatic) blocks may optionally be added as long as it does not appreciably hinder the radiation curing process as a result of mixing on a molecular level with the conjugated diene blocks.

In some embodiments, the curable adhesive composition according to the invention may also contain one or more plasticizers such as rubber extending or compound oils. Suitable plasticizers include predominantly plasticizing paraffinic or naphthenic oils (carbon aromatic distribution<5%, preferably <2%, more preferably 0% as determined according to DIN 51378) as well as aromatic content oils.

Plasticizers can also include the use of olefin oligomers and low molecular weight polymers as well as vegetable and animal oil and their derivatives. The oligomers may be polypropylene, polybutene, hydrogenated polyisoprene, hydrogenated polybutadiene, liquid styrene/isoprene copolymers or liquid hydrogenated styrene/conjugated diene copolymers, or the like having apparent molecular weights preferably between about 200 and about about 30,000. Additionally plasticizers can include vegetable and animal oils such as glyceryl esters of usual fatty acids, as well as polymerization. The petroleum derived oils which may be employed are relatively high boiling materials and preferably contain only a minor proportion of aromatic hydrocarbons (preferably less than 30 percent and, more preferably, less than 15 percent by weight of the oil).

Examples of suitable plasticizer oils which are commercially available are those from the Royal Dutch Shell Group of companies, such as SHELLFLEX™, CATENEX™, ONDINA™, RISELLA™, PRIMOL™ and EDELEX™ oils. Other oils include KAYDOL™ oil from Witco, or TUF-FLO™ oils from Arco. Other plasticizers include compatible liquid tackifying resins such as REGALREZ™ R-1018. Of these ONDINA, RISELA and PRIMOL oils are known as totally non-aromatic oils.

The amount of plasticizer and oil employed varies from 0 to about 500 phr each (parts by weight per hundred parts by weight of block copolymer), more preferably from about 1 to about 50, about 1 to about 25, about 1 to about 20, or about 2 to about 20 phr, and most preferably from about 2 to about 10 phr.

As noted hereinbefore, the curable adhesive composition according to the present invention may, but need not, contain a plasticizer. In the event that the composition does contain a plasticizer, then the composition comprises up to about 100 parts by weight, preferably from about 5 to about 100 pbw, more preferably from about 10 to about 50 pbw of a plasticizers per 100 parts of block terpolymer. Indeed terpolymer may be pre-blended with a small amount of plasticizer by the manufacturer of said terpolymer.

Various petroleum derived waxes may also be present in the composition in order to impart fluidity in the molten condition of the adhesive and flexibility to the set adhesive, and to serve as a wetting agent for bonding cellulosic fibres. The term "petroleum derived wax" includes both paraffin and microcrystalline waxes having a melting point within the range of about 54° C. to about 107° C. as well as synthetic waxes such as low molecular weight polyethylene or Fisher-Tropsch waxes. The amount of petroleum derived waxes employed herein varies from 0 to about 100 pbw, preferably from 0 to about 15 pbw.

It will be appreciated that the best results are achieved when, like the tackifying resins, the plasticizers and oils contain low levels of unsaturation. Additionally, it is also preferably to minimize the aromatic content thereof.

In some embodiments the curable adhesive composition of the present invention may further contain conventional additives such as e.g. stabilizers, pigments, fillers and the like but the compositions should be free of other additives and impurities which adversely affect the adhesive sealant or coating properties of the composition, and particularly the high temperature properties thereof.

Stabilizers and oxidation inhibitors are typically added to the commercially available compounds in order to protect the ingredients against degradation during preparation and use of the adhesive compositions, however without interfering with the irradiation curing of the polymer. Combinations of stabilizers are often more effective due to the different mechanisms of degradation to which various polymers are subject. Certain hindered phenols, organo-metallic compounds, aromatic amines, aromatic phosphites, and sulphur compounds are useful for this purpose. Examples of effective types of these materials include phenolic antioxidants, thio compounds, and tris-(nonylated phenyl)phosphates.

Several types of antioxidants can be used, either primary antioxidants like hindered phenols or secondary antioxidants like phosphite derivatives or blends thereof. Examples of commercially available antioxidants are IRGANOX™ 565 from Ciba-Geigy (2,4-bis-(n-octylthio)-6-(4-hydroxy-3,5-di-tertiary-butyl anilino)-1,3,5-triazine), IRGANOX 1010 from Ciba-Geigy (tetrakis-ethylene-(3,5-di-tertiary-butyl-4-hydroxy-hydrocinnamate)methan-e) and POLYGARD™ HR from Uniroyal (tris-(2,4-di-tertiary-butyl-phenyl)phosphite). Other antioxidants developed to protect the gelling of the polybutadiene segments can also be use, like the SUMILIZER™ GS from Sumitomo (2[1-(2-hydroxy-3,5-di-terpentylphenyl)ethyl)]4,6-di-tert-pentylphenylacrylate); SUMILIZER T-PD from Sumitomo (pentaerythrythyltetrakis(3-dodecylthiopropionate)); or mixtures thereof.

No particular limitation is imposed on the preparation process of the adhesive composition. Therefore, there may be used any process such as a mechanically mixing process making use of rolls, a Banbury mixer or a Dalton kneader, a hot-melt process characterized in that heating and mixing are conducted by using a melting kettle equipped with a stirrer, like a high shear Z-blade mixer or a single- or twin-screw extruder, or a solvent process in which the compounding components are poured in a suitable solvent and stirred, thereby obtaining an intimate solution of the pressure sensitive adhesive composition.

Adhesives of the present invention are especially suited for preparation as 100% solids hot-melt adhesives since they give relatively low processing viscosities, less than hundred thousand centipoise, and adequate pot life, up to several hours, at processing temperatures of from 150° C. to 180° C. A preferred method for processing is the use of an extruder to mix the adhesive and feed the coating die as is disclosed in U.S. Pat. No. 3,984,509.

The compositions of the present invention may be cured by exposure to high energy ionizing radiation such as electron beam radiation or by UV radiation. The electron beam radiation or high energy ionizing radiation which employed to effect the cross-linking reaction can be obtained from any suitable source such as an atomic pile, an electron gun, a resonant transformer accelerator, a Van de Graaf electron accelerator, a Lineac electron accelerator, a betatron, a synchrotron, a cyclotron, or the like. Radiation from these sources will produce ionizing radiation such as electrons, protons, neutrons, deuterons, gamma rays, X rays, alpha particles, and beta particles.

The cross-linking reaction is conveniently effected at room temperature, but it can be conducted at depressed or elevated temperatures if desired. It is also within the spirit and scope of the invention to effect the cross-linking reaction within the confines of an inert atmosphere to prevent interference in the block copolymer cross-linking, particularly at an exposed surface.

Additionally, cross-linking may be effected when irradiating the composition which is sandwiched between substrates such as when the composition is utilized as a tie-layer between these substrates. Similarly, when the cross-linking reaction is not conducted within the confines of an inert atmosphere, release paper may be placed over the exposed composition surface contacting and covering the same. Thus, the composition may be cross-linked by irradiation through the release paper or the substrate.

The amount of irradiation required to produce a satisfactory cure depends primarily upon the type and concentration of the block copolymer employed and the unsaturation level present in the composition. Suitable dosages of electron beam irradiation are in the range from 0.5 to 8 Mrad, preferably about 4 Mrad to about 8 Mrad, and more preferably about 6 Mrad to about 8 Mrad.

Furthermore, when the use of ultra violet light is contemplated, photoinitiators can be employed such as e.g. methylbenzoin, benzoin acetate, benzophenone, benzil dimethylketal or ethyl anthraquinone/4,4-bis(dimethyl amiano)benzophenone. Photoinitiators can be employed for use with the adhesive compositions.

PSA compositions according to the present invention may be applied with or without without using any solvent (e.g., hot-melt) or in the form of their solutions to a base material such as paper or a plastic film by means of a proper coater, thereby producing various kinds of pressure sensitive adhesive tapes or sheets. It may also be used as an adhesive or a sealant without applying to a base material.

During label manufacture, a laminate of a face stock, pressure sensitive adhesive layer and a release liner is passed through an apparatus which converts the laminate into commercially useful labels and label stock. The process involves, amongst others, die-cutting and matrix stripping to leave labels on a release liner.

It will be appreciated that another aspect of the present invention is formed by the use of tapes, labels or bandages on packed frozen articles such as food, medicines and the like. A more particular aspect is formed by the use of repositionable or removable tapes or labels on frozen articles.

The present invention will hereinafter be illustrated more specifically by the following examples, however without restricting the scope to these specific embodiments.

EXAMPLES

A film was made using Polymer #1 according to the invention as well as comparative polymer A (known as Kraton Polymers D-1161) and comparative polymer B. Polymer #1 is an SIBIS block terpolymer having a styrene content of 19%, a total molecular weight of 180,000, a diblock content of 18%, and a vinyl content of 33%. Additionally, the ratio of isoprene to butadiene is 70:30, and the molecular weight of the styrene blocks together is 10,600. Comparative polymer A is an SIS block copolymer having a styrene content of 15%, a total molecular weight of 220,000, isoprene block molecular weight of 210,000, 20% diblock content, and a vinyl content of 9%. Furthermore, comparative polymer B is an SIBS block copolymer with a styrene content of 19%, a total molecular weight of 195,000, a 15% diblock content, and a vinyl content of 9%. Additionally, the ratio of isoprene to butadiene is 50:50, and the molecular weight of the styrene blocks together is 10,600.

The films were prepared using formulated compositions according to the following table:

TABLE 1

| Composition | phr |
| --- | --- |
| Polymer | 100 |
| Hexane diol diacrylate | 10 |
| Drakeol 34 (oil) | 10 |
| Irgacure 651 (antioxidant) | 4 |

The above films were then cured under the following conditions: UV source/energy 1000 mj/sq-cm for 15 minutes. The Oven used employed a wavelength of 254 nm. After curing, gel content and swelling in toluene were measured.

TABLE 2

| | Gel content | | |
|---|---|---|---|
| Film | Weight$_{initial}$ | Weight$_{dried}$ | Gel content % |
| Polymer #1 | 1.5295 | 0.7719 | 50.5 |
| Comparative #A | 1.4249 | 0.7098 | 49.8 |
| Comparative #B | 1.4142 | 0.6211 | 43.9 |

TABLE 3

| | Swelling in Toluene | | |
|---|---|---|---|
| Film | Weight$_{initial}$ | Weight$_{dried}$ | % Swelling Toluene |
| Polymer #1 | 0.7669 | 0.7117 | 106 |
| Comparative #A | 0.9561 | 0.9026 | 106 |
| Comparative #B | 0.6554 | 0.6197 | 106 |

What is claimed is:

1. An elastomeric block copolymer comprising a molecular structure according to the general formula:

A-I-B-I-A     (1)

or (A-I-B)$_n$-X     (2), wherein each A is independently a polymer block of predominantly an aromatic vinyl compound, each I is predominantly isoprene, each B is predominantly butadiene, n is an integer equal to or greater than 2, and X is the residue of a coupling agent, and wherein:
  (i) the weight ratio of I to B is in a range of 30:70 to 70:30;
  (ii) the aromatic vinyl compound content of the block copolymer is 14 to 45 wt %;
  (iii) the B block has a 1,2-vinyl bond content in the range of from 30 to 60 mol %;
  (iv) the A block has an apparent molecular weight in the range of from 5,000 to 20,000, and the I and B blocks together have an apparent molecular weight in the range of from 50,000 to 200,000; and
  (v) the coupling efficiency of (A-I-B)$_n$-X ranges from 40% to 98%.

2. The elastomeric block copolymer of claim 1 wherein the aromatic vinyl compound is predominantly polystyrene.

3. The elastomeric block copolymer of claim 2, wherein the 1,2, vinyl bond content is greater than 40 mol %.

4. The elastomeric block copolymer of claim 2, wherein the I and B blocks together have an apparent molecular weight in the range of from 75,000 to 200,000.

5. The elastomeric block copolymer of claim 2, wherein the polystyrene content is from 14 to 25%.

6. A photocurable composition comprising:
  (a) an elastomeric block copolymer comprising a molecular structure according to the general formula:

A-I-B-I-A     (1)

or (A-I-B)$_n$-X     (2), wherein each A is independently a polymer block of predominantly an aromatic vinyl compound, each I is predominantly isoprene, each B is predominantly butadiene, n is an integer equal to or greater than 2, and X is the residue of a coupling agent, and wherein:
    (i) the weight ratio of I to B is in a range of 30:70 to 70:30;
    (ii) the aromatic vinyl compound content of the block copolymer is 14 to 45 wt %;
    (iii) the B block has a 1,2-vinyl bond content in the range of from 30 to 60 mol %;
    (iv) the A block has an apparent molecular weight in the range of from 5,000 to 20,000, and the I and B blocks together have an apparent molecular weight in the range of from 50,000 to 200,000; and
    (v) the coupling efficiency of (A-I-B)$_n$—X ranges from 40% to 98%
  (b) from 1 to 60% by weight, based on the weight of components (a) and (b), of one or more ethylenically unsaturated compounds;
  (c) from 0.1 to 10% by weight, based on the weight of the total photocurable composition of one or more photoinitiators or photoinitiator systems; and
  (d) from 0 to 40% by weight, based on the total photocurable compound, of one or more auxiliaries.

7. The photocurable composition of claim 6, wherein component (a) is from 20 to 98.9 wt %, based on the total weight of components (a) and (b).

8. The photocurable composition of claim 6, wherein component (a) is at least 40% by weight, based on the total weight of components (a) and (b).

9. The photocurable composition of claim 6, wherein the tri-block content occurs in a content of at most 40% based on the weight of components (a) and (b).

10. The photocurable composition of claim 6, wherein the aromatic vinyl compound of the elastomeric block copolymer is predominantly aromatic vinyl compound.

11. The photocurable composition of claim 6, wherein the 1,2, vinyl bond content of the elastomeric block copolymer is greater than 40 mol %.

12. The photocurable composition of claim 6, wherein the I and B blocks of the elastomeric block copolymer together have an apparent molecular weight in the range of from 75,000 to 150,000.

13. The photocurable block copolymer of claim 6, wherein the aromatic vinyl content of the elastomeric block copolymer is from 14 to 25%.

14. A flexographic printing plate derived from the photocurable composition according to claim 6.

15. A flexographic printing plate derived from a photocurable composition, said flexographic printing plate comprising a support layer, one or more photocurable layers comprising:
  (a) 20 to 98.0% by weight, based on the weight of components (a) and (b), of one or more elastomeric block copolymers comprising a molecular structure according to the general formula:

A-I-B-I-A     (1)

or (A-I-B)$_n$-X     (2), wherein each A is independently a polymer block of an aromatic vinyl compound, each I is predominantly isoprene, each B is predominantly butadiene, n is an integer equal to or greater than 2, and X is the residue of a coupling agent, and wherein:
    (i) the weight ratio of I to B is in a range of 30:70 to 70:30;
    (ii) the aromatic vinyl compound content of the block copolymer is 14 to 45 wt %;
    (iii) the B block has a 1,2-vinyl bond content in the range of from 20 to 90 mol %;
    (iv) the A block has an apparent molecular weight in the range of from 5,000 to 20,000, and the I and B blocks together have an apparent molecular weight in the range of from 50,000 to 200,000; and (v) the coupling efficiency of $(A-I-B)_n-X$ ranges from 40% to 98%
(b) from 1 to 60% by weight, based on the weight of components (a) and (b), of one or more ethylenically unsaturated compounds;
(c) from 0.1 to 10% by weight, based on the total weight of the photocurable composition, of one or more photoinitiators or photoinitiator systems;
(d) from 0 to 40% by weight, based on the total photopolymerizable composition of one or more auxiliaries.

16. The flexographic printing plate of claim 15, wherein component (a) is from 20 to 98.9% of the weight of components (a) and (b).

17. The flexographic printing plate of claim 15, wherein component (a) is at least 40% based on the weight of components (a) and (b).

18. An adhesive composition comprising a radiation sensitive block copolymer having the general formula:

A-I-B-I-A    (1)

or $(A-B)_n-X$    (2), wherein each A is independently a polymer block of predominantly an aromatic vinyl compound, each I is predominantly isoprene, each B is predominantly butadiene, n is an integer equal to or greater than 2, and X is the residue of a coupling agent, and wherein:
(i) the weight ratio of I to B is in a range of 30:70 to 70:30;
(ii) the aromatic vinyl compound content of the block copolymer is 14 to 45 wt %;
(iii) the B block has a 1,2-vinyl bond content in the range of from 30 to 60 mol %;
(iv) the A block has an apparent molecular weight in the range of from 5,000 to 20,000, and the I and B blocks together have an apparent molecular weight in the range of from 50,000 to 200,000; and
(v) the coupling efficiency of $(A-I-B)_n-X$ ranges from 40% to 98%.

19. The adhesive composition of claim 18 wherein the adhesive composition is a hot melt adhesive.

20. The adhesive composition of claim 18 wherein the adhesive composition is a pressure sensitive adhesive.

* * * * *